(12) United States Patent
Nakayama et al.

(10) Patent No.: US 9,632,146 B2
(45) Date of Patent: Apr. 25, 2017

(54) DETERIORATION DETERMINING DEVICE FOR BATTERY

(71) Applicant: TOYOTA JIDOSHA KABUSHIKI KAISHA, Toyota-shi, Aichi-ken (JP)

(72) Inventors: Hiroyuki Nakayama, Okazaki (JP); Makoto Nakashima, Toyota (JP); Masato Komatsuki, Hashima-gun (JP); Yasuhide Kurimoto, Kasugai (JP)

(73) Assignee: TOYOTA JIDOSHA KABUSHIKI KAISHA, Toyota-shi, Aichi-ken (JP)

(*) Notice: Subject to any disclaimer, the term of this patent is extended or adjusted under 35 U.S.C. 154(b) by 91 days.

(21) Appl. No.: 14/620,322

(22) Filed: Feb. 12, 2015

(65) Prior Publication Data

US 2015/0268308 A1 Sep. 24, 2015

(30) Foreign Application Priority Data

Mar. 19, 2014 (JP) ................. 2014-056327

(51) Int. Cl.
*G01R 31/36* (2006.01)
*G01L 7/00* (2006.01)
*B60L 11/18* (2006.01)
*H01M 10/48* (2006.01)

(52) U.S. Cl.
CPC .......... *G01R 31/3679* (2013.01); *B60L 11/18* (2013.01); *G01L 7/00* (2013.01); *H01M 10/48* (2013.01); *H01M 10/486* (2013.01)

(58) Field of Classification Search
CPC ...... G01L 7/00; G01R 31/3679; H01M 10/48; H01M 10/486; B60L 11/18

USPC .......................................... 320/147
See application file for complete search history.

(56) References Cited

U.S. PATENT DOCUMENTS

| 6,635,379 | B2* | 10/2003 | Onishi | H01M 6/5083 429/48 |
| 2004/0146777 | A1* | 7/2004 | Forlino | H01M 2/0275 429/122 |
| 2007/0120537 | A1* | 5/2007 | Yamamoto | G01R 31/3679 320/150 |
| 2012/0130655 | A1 | 5/2012 | Mitsuda et al. | |
| 2013/0076363 | A1 | 3/2013 | Takahashi et al. | |
| 2013/0093383 | A1* | 4/2013 | Kim | H02J 7/0026 320/107 |

FOREIGN PATENT DOCUMENTS

| JP | 2002-042896 A | 2/2002 |
| JP | 2011-258337 A | 12/2011 |
| JP | 2012-127938 A | 7/2012 |
| JP | 2012-185122 A | 9/2012 |
| JP | 2013-084198 A | 5/2013 |

\* cited by examiner

*Primary Examiner* — Patrick Assouad
*Assistant Examiner* — Haidong Zhang
(74) *Attorney, Agent, or Firm* — Sughrue Mion, PLLC (57) ABSTRACT

A PC executes a control process including the steps of: calculating an internal pressure increase amount P; calculating an internal pressure fluctuation amount ΔP; calculating a deterioration evaluation value D1; calculating a deterioration evaluation value D2; determining that a battery can be shipped as a secondhand battery when D1+D2 is equal to or smaller than a threshold value A; and determining that the battery cannot be shipped as a secondhand battery when D1+D2 is larger than the threshold value A.

7 Claims, 8 Drawing Sheets

DETERIORATION DETERMINING DEVICE FOR BATTERY

This nonprovisional application is based on Japanese Patent Application No. 2014-056327 filed on Mar. 19, 2014 with the Japan Patent Office, the entire contents of which are hereby incorporated by reference.

BACKGROUND OF THE INVENTION

Field of the Invention

The present invention relates to a technique of determining a deterioration state of a battery with a high degree of accuracy.

Description of the Background Art

A technique of determining whether a battery can be reused or not based on a deterioration state of the battery is known. As the technique of determining the deterioration state of the battery, Japanese Patent Laying-Open No. 2012-127938, for example, discloses a technique of calculating a degree of deterioration of a power storage device with respect to a calendar life or cycle life, based on the number of cycle damages based on a charging current value, a charging time and a representative temperature of the power storage device.

In a sealed battery, a component such as a resin member, a gas discharge valve or a CID (Current Interrupt Device) is, for example, used to maintain a sealed state. Due to fluctuations in internal pressure of the battery depending on age deterioration, usage conditions and the like, fatigue may be accumulated and deterioration may progress in these components. Therefore, in order to determine the deterioration state of the battery with a higher degree of accuracy, the fluctuations in internal pressure of the battery must also be taken into consideration.

SUMMARY OF THE INVENTION

An object of the present invention is to provide a deterioration determining device that determines a deterioration state of a battery with a high degree of accuracy, in consideration of fluctuations in internal pressure of the battery.

A deterioration determining device for a battery according to an aspect of the present invention includes: a calculating unit for calculating the number of fluctuations when a differential pressure between an internal pressure and an external pressure of a battery fluctuates at a predetermined amount of fluctuation, calculating a time in which the differential pressure becomes a predetermined differential pressure, and calculating at least either one of a first deterioration evaluation value and a second deterioration evaluation value, the first deterioration evaluation value being based on a first ratio between the calculated number of fluctuations and the predetermined upper limit number of fluctuations corresponding to the predetermined amount of fluctuation, and the second deterioration evaluation value being based on a second ratio between the calculated time and a predetermined upper limit time corresponding to the predetermined differential pressure; and a deterioration determining unit for determining a deterioration state of the battery based on at least either one of the first deterioration evaluation value and the second deterioration evaluation value calculated by the calculating unit.

With this, both the first deterioration evaluation value and the second deterioration evaluation value are calculated in consideration of the differential pressure between the internal pressure and the external pressure of the battery. Therefore, the deterioration state of the battery is determined based on at least either one of the first deterioration evaluation value and the second deterioration evaluation value, and thereby, the deterioration state of the battery can be determined with a high degree of accuracy, in consideration of fluctuations in internal pressure of the battery. Thus, it is possible to provide the deterioration determining device that determines the deterioration state of the battery with a high degree of accuracy, in consideration of fluctuations in internal pressure of the battery.

Preferably, the deterioration determining unit determines that the battery is in a deteriorated state, when a sum of the first deterioration evaluation value and the second deterioration evaluation value is larger than a threshold value.

With this, when the sum of the first deterioration evaluation value and the second deterioration evaluation value is larger than the threshold value, it can be determined that certain fatigue has been accumulated in the components of the battery. Therefore, in such a case, it is determined that the battery is in the deteriorated state, and thereby, the deterioration state of the battery can be determined with a high degree of accuracy.

More preferably, the calculating unit calculates a plurality of the first ratios corresponding to a plurality of amounts of fluctuation, respectively, which include the predetermined amount of fluctuation, and calculates a sum of the plurality of the first ratios as the first deterioration evaluation value.

With this, the sum of the plurality of the first ratios corresponding to the plurality of amounts of fluctuation, respectively, can be calculated as the first deterioration evaluation value. Thus, the deterioration state of the battery can be determined with a high degree of accuracy.

More preferably, the calculating unit calculates a plurality of the second ratios corresponding to a plurality of differential pressures, respectively, which include the predetermined differential pressure, and calculates a sum of the plurality of the second ratios as the second deterioration evaluation value.

With this, the sum of the second ratios corresponding to the plurality of differential pressures, respectively, can be calculated as the second deterioration evaluation value. Thus, the deterioration state of the battery can be determined with a high degree of accuracy.

More preferably, the deterioration determining device further includes a reuse determining unit for determining whether the battery can be reused or not, based on a result of comparison between a threshold value and a sum of the first deterioration evaluation value and the second deterioration evaluation value.

With this, it can be determined whether certain fatigue has been accumulated in the components of the battery or not, based on comparison between the threshold value and the sum of the first deterioration evaluation value and the second deterioration evaluation value. Thus, it can be determined with a high degree of accuracy whether the battery can be reused or not, based on the result of comparison.

More preferably, the deterioration determining device further includes a reuse determining unit for determining that the battery can be reused in a prescribed region when a sum of the first deterioration evaluation value and the second deterioration evaluation value is smaller than a first threshold value, determining that the battery cannot be reused when the sum of the first deterioration evaluation value and the second deterioration evaluation value is larger than a second threshold value, and determining that the battery can be reused in a region narrower than the prescribed region when the sum of the first deterioration evaluation value and the second deterioration evaluation value is between the first threshold value and the second threshold value. The second threshold value is larger than the first threshold value.

With this, the region where the battery can be reused can be specified by using the first threshold value and the second threshold value, and thus, the battery can be reused effectively.

More preferably, the battery and the deterioration determining device are mounted on a vehicle. During driving of the vehicle, the deterioration determining unit determines the deterioration state of the battery based on at least either one of the first deterioration evaluation value and the second deterioration evaluation value.

With this, even during driving of the vehicle, the deterioration state of the battery can be determined with a high degree of accuracy.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings. In the following description, the same components are indicated by the same reference characters. Their names and functions are also the same. Therefore, detailed description of them will not be repeated.

Figure 1:
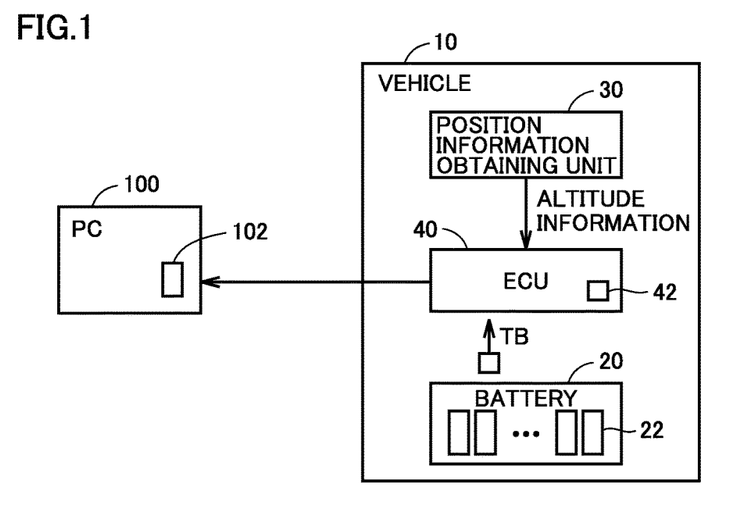
FIG. 1 is a block diagram for describing a configuration of a deterioration determining device according to the present embodiment.

As shown in FIG. 1, a deterioration determining device according to the present embodiment is implemented by a personal computer (hereinafter described as "PC") 100.

PC 100 is placed in, for example, a battery replacement station for replacing a battery 20 mounted on a vehicle 10 with a replacement battery, a shop (such as a dealer, a used car dealership or a repair shop) that recovers battery 20, a location where recovered battery 20 is stored and managed for reuse or recycling, and other locations.

PC 100 determines a deterioration state of battery 20 used in vehicle 10. PC 100 may determine the deterioration state of battery 20 mounted on vehicle 10, or may determine the deterioration state of battery 20 removed from vehicle 10. Based on the result of determination of the deterioration state of battery 20, PC 100 determines whether battery 20 can be reused or not in other vehicles as a secondhand battery, and whether battery 20 needs to be recycled or not.

When determining the deterioration state of battery 20, PC 100 preliminarily obtains information about battery 20 from an ECU (Electronic Control Unit) 40 of vehicle 10. PC 100 stores the obtained information in a storage medium 102 in PC 100. Storage medium 102 may be a storage medium such as, for example, a memory and a hard disk, and is not particularly limited.

ECU 40 obtains a history (temporal change) of a temperature TB of a battery cell 22 included in battery 20 (hereinafter described as "battery temperature TB") by using a battery temperature sensor 44, and stores the history of battery temperature TB in a memory 42 in ECU 40. For example, ECU 40 obtains battery temperature TB for each prescribed time interval (e.g., a maximum value for 10 minutes) by using battery temperature sensor 44, and stores battery temperature TB in memory 42 in ECU 40. During driving and stop of vehicle 10, ECU 40 obtains the history of battery temperature TB by using battery temperature sensor 44, and stores the history of battery temperature TB in memory 42.

ECU 40 also obtains altitude information (temporal change in altitude) of vehicle 10 from a position information obtaining unit 30, and stores the altitude information in memory 42. During driving and stop of vehicle 10, ECU 40 stores, in memory 42, the altitude information obtained from position information obtaining unit 30. The altitude information may be at least information that can specify the atmospheric pressure outside vehicle 10. Position information obtaining unit 30 is, for example, a car navigation system or a GPS. Position information obtaining unit 30 obtains the altitude information corresponding to the current position based on, for example, the current position of vehicle 10 and the map information (including the altitude information) including the current position, and transmits the altitude information to ECU 40. ECU 40 stores, for example, the altitude information for each prescribed time interval (e.g., every 10 minutes). It is desirable that ECU 40 synchronizes and stores the altitude information and the history of battery temperature TB, for example. ECU 40 may, for example, store the altitude information when battery temperature TB for the prescribed time interval has a maximum value.

When ECU 40 is connected to PC 100 to allow communication therebetween (e.g., when a terminal for failure diagnosis of vehicle 10 and PC 100 are connected via a communication cable), ECU 40 transmits the history of battery temperature TB and the altitude information stored in memory 42 to PC 100 in response to a transmission request from PC 100.

Vehicle 10 may be, for example, a hybrid vehicle having mounted thereon an engine and a driving motor supplied with electric power of battery 20, or may be an electric powered vehicle on which an engine is not mounted and a driving motor supplied with electric power of battery 20 is mounted as a driving source.

A secondary battery such as a nickel-metal hydride secondary battery or a lithium ion secondary battery is, for example, used as battery 20. Battery 20 may be a battery including at least one or more sealed battery cells 22, and is not particularly limited to the secondary battery of the aforementioned type.

Battery 20 includes one or more sealed battery cells 22. In order to maintain the sealed state, battery cell 22 includes a component such as a seal member made from resin and the like, a gas discharge valve or a CID (Current Interrupt Device). The CID is a pressure-type current interrupting mechanism, and interrupts electrical connection between a battery element in battery cell 22 and an external terminal provided outside battery cell 22, when an internal pressure of the battery cell (pressure inside a case of the battery cell) increases. The gas discharge valve is used to discharge a gas generated in battery cell 22.

Due to fluctuations in internal pressure of battery cell 22 depending on age deterioration, usage conditions and the like, fatigue may be accumulated and deterioration may progress in these components. Therefore, in order to determine the deterioration state with a higher degree of accuracy, the fluctuations in internal pressure of battery cell 22 must also be taken into consideration.

Thus, the present embodiment is characterized in that PC 100 operates as follows.

Specifically, PC 100 calculates the number of fluctuations $n(\Delta P(x))$ when a differential pressure P' between an internal pressure Pin and an external pressure Pout of battery cell 22 fluctuates at a fluctuation amount $\Delta P(x)$, and calculates a first deterioration evaluation value D1 based on a first ratio $n(\Delta P(x))/N(\Delta P(x))$ between the calculated number of fluctuations $n(\Delta P(x))$ and the predetermined upper limit number of fluctuations $N(\Delta P(x))$ corresponding to fluctuation amount $\Delta P(x)$.

Furthermore, PC 100 calculates a time (in the following description, described as "stay time") $t'(P'(x), TB(x))$ in which differential pressure P' becomes a differential pressure $P'(x)$ and battery temperature TB becomes a temperature $TB(x)$, and calculates a second deterioration evaluation value D2 based on a second ratio $t'(P'(x), TB(x))/T'(P'(x), TB(x))$ between calculated stay time $t'(P'(x), TB(x))$ and a predetermined upper limit stay time $T'(P'(x), TB(x))$ corresponding to differential pressure $P'(x)$ and temperature $TB(x)$.

Furthermore, PC 100 determines the deterioration state of the components of battery cell 22 based on first deterioration evaluation value D1 and second deterioration evaluation value D2. In the present embodiment, PC 100 determines whether battery 20 including battery cell 22 can be reused or not, based on a result of comparison between a threshold value and a sum of first deterioration evaluation value D1 and second deterioration evaluation value D2.

In the present embodiment, the upper limit number of fluctuations $N(\Delta Px)$ corresponding to fluctuation amount $\Delta P(x)$ is described as the number in which the components of battery cell 22 reach a failed state when differential pressure P' repeatedly fluctuates at fluctuation amount $\Delta P(x)$. However, a value obtained by adding a margin to this number may be used as the upper limit number of fluctuations.

In addition, in the present embodiment, predetermined upper limit stay time $T'(P'(x), TB(x))$ corresponding to differential pressure $P'(x)$ and temperature $TB(x)$ is described as a time elapsed before the components of battery cell 22 reach a failed state in the case of differential pressure $P'(x)$ and temperature $TB(x)$. However, a value obtained by adding a margin to this elapsed time may be used as the upper limit stay time.

Figure 2:
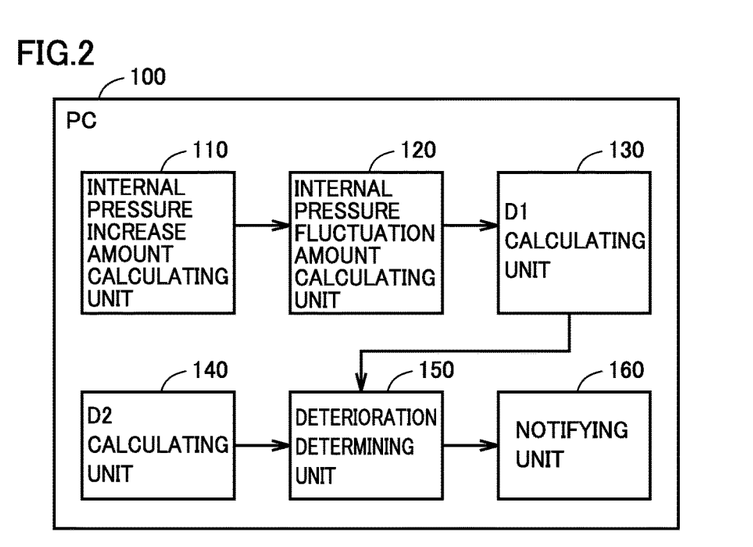
FIG. 2 is a functional block diagram of a PC which is the deterioration determining device according to the present embodiment.

FIG. 2 shows a functional block diagram of PC 100 which is the deterioration determining device according to the present embodiment. PC 100 includes an internal pressure increase amount calculating unit 110, an internal pressure fluctuation amount calculating unit 120, a D1 calculating unit 130, a D2 calculating unit 140, a deterioration determining unit 150, and a notifying unit 160.

Internal pressure increase amount calculating unit 110 preliminarily calculates a relation between battery temperature TB and an internal pressure increase speed k, and calculates an internal pressure increase amount P based on the calculated relation between battery temperature TB and internal pressure increase speed k as well as the history of battery temperature TB received from ECU 40.

Figure 3:
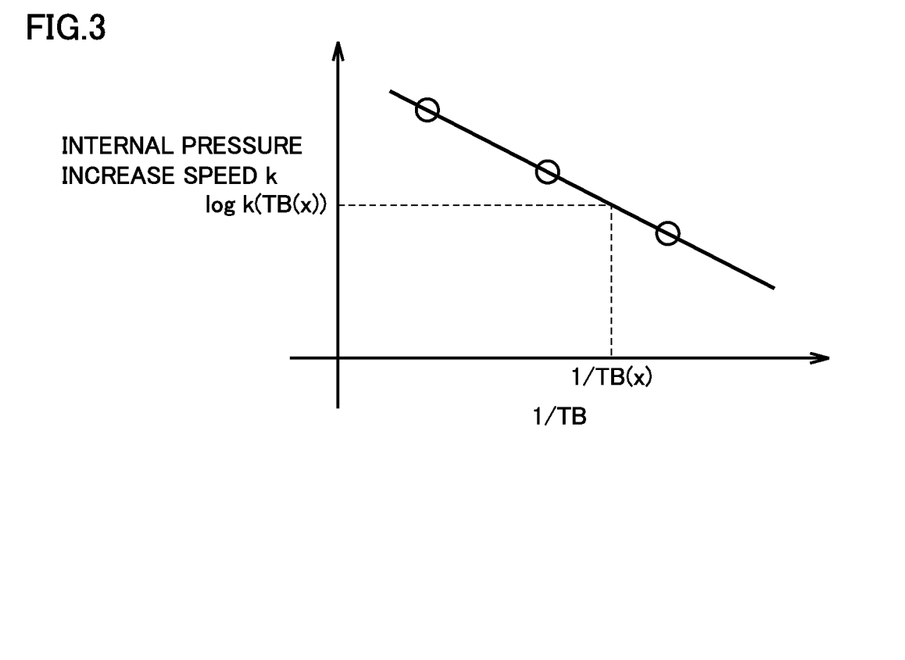
FIG. 3 shows a relation between a battery temperature and an internal pressure increase speed.

A specific method for calculating internal pressure increase amount P will be described below. FIG. 3 shows a relation between battery temperature TB and internal pressure increase speed k. The vertical axis in FIG. 3 indicates a logarithmic value of internal pressure increase speed k, and the horizontal axis in FIG. 3 indicates a reciprocal of battery temperature TB. Such a graph is also referred to as an Arrhenius plot in some cases. The Arrhenius plot can be known from, for example, design data, experimental data and the like of battery cell 22.

The relation between internal pressure increase speed k and battery temperature TB is preliminarily calculated by a bench test and the like. For example, the relation between the logarithmic value (logarithmic value such as a common logarithm or a natural logarithm) of internal pressure increase speed k and the reciprocal of battery temperature TB can be expressed by a linear function equation. Therefore, by obtaining a combination of internal pressure increase speed k and battery temperature TB at two or more points by the bench test and the like, an inclination and an intercept of the linear function equation are calculated. Based on the linear function equation obtained from the calculated inclination and intercept, a logarithmic value of an internal pressure increase speed $k(TB(x))$ with respect to temperature $TB(x)$ can be calculated as shown in FIG. 3. As shown in FIG. 3, as battery temperature TB becomes higher (the reciprocal of battery temperature TB becomes smaller), internal pressure increase speed k (the logarithmic value of internal pressure increase speed k) becomes higher. The relation between internal pressure increase speed k and battery temperature TB shown in FIG. 3 is one example and the relation is not limited to the relation shown in FIG. 3.

Figure 4:
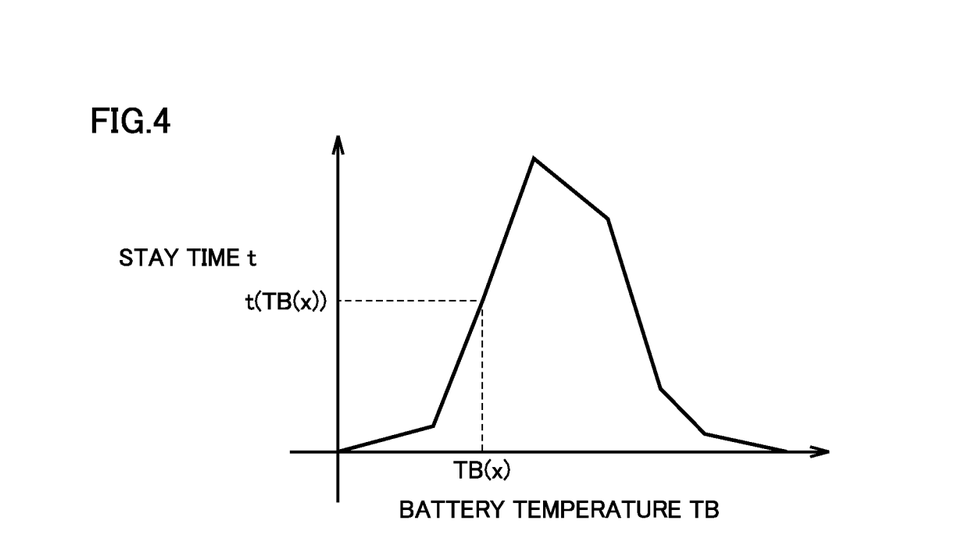
FIG. 4 shows a relation between a battery temperature and a stay time.

FIG. 4 shows a relation between battery temperature TB and a stay time t. The vertical axis in FIG. 4 indicates stay time t, and the horizontal axis in FIG. 4 indicates battery temperature TB. Internal pressure increase amount calculating unit 110 may receive, from ECU 40, data indicating the relation between battery temperature TB and stay time t shown in FIG. 4, or may receive the history (temporal change) of battery temperature TB from ECU 40 and create the data indicating the relation between battery temperature TB and stay time t shown in FIG. 4.

The data indicating the relation between battery temperature TB and stay time t shown in FIG. 4 is created in PC 100 or ECU 40 as described below, for example.

For example, battery temperature TB for a prescribed time period obtained from the history of battery temperature TB is read in a prescribed order. The prescribed time period may be the entire time period of the history of battery temperature TB, or may be any of a plurality of time periods into which the entire time period is divided. The prescribed order is, for example, a descending order of value, an ascending order of value, or an order of obtainment. Then, it is specified which temperature range of a plurality of temperatures TB(1) to TB(m) battery temperature TB thus read is associated with. A prescribed time (e.g., 10 minutes) is added to the stay time associated with the specified temperature range. The prescribed time is the same as the time interval when battery temperature TB is stored in memory 42 as the history as described above. The plurality of temperatures TB(1) to TB(m) are, for example, associated with a plurality of temperature ranges each having a prescribed temperature interval (e.g., interval of 1° C.), respectively. Such a process is executed on all battery temperatures TB for the prescribed time period included in the history of battery temperature TB, thereby creating the data indicating the relation between battery temperature TB and stay time t shown in FIG. 4.

The data indicating the relation between battery temperature TB and stay time t shown in FIG. 4 is created, and thereby, a stay time t(TB(x)) in which battery temperature TB becomes temperature TB(x) can, for example, be calculated. As shown in FIG. 4, the relation between battery temperature TB and stay time t is such that the stay time is the longest near the center between battery temperatures TB(1) and TB(m), and as battery temperature TB comes closer to battery temperature TB(1) (battery temperature TB becomes lower) or as battery temperature TB comes closer to battery temperature TB(m) (battery temperature TB becomes higher), stay time t becomes shorter. The relation between battery temperature TB and stay time t shown in FIG. 4 is one example and the relation is not limited to the relation shown in FIG. 4.

Internal pressure increase amount calculating unit 110 calculates internal pressure increase amount P based on a value obtained by multiplying internal pressure increase speed k shown in FIG. 3 by stay time t shown in FIG. 4. Specifically, internal pressure increase amount calculating unit 110 calculates internal pressure increase amount P in accordance with the following equation:

internal pressure increase amount $P = \Sigma\{t(TB(m)) \times k(TB(m))\}$.

A specific method for calculating internal pressure increase amount P will be described below. For example, from the linear function equation shown in FIG. 3, internal pressure increase amount calculating unit 110 calculates an internal pressure increase speed k(TB(1)) when battery temperature TB is TB(1). From the relation between battery temperature TB and stay time t shown in FIG. 4, internal pressure increase amount calculating unit 110 derives a stay time t(TB(1)) when battery temperature TB is TB(1). Internal pressure increase amount calculating unit 110 multiplies stay time t(TB(1)) by internal pressure increase speed k(TB(1)) to calculate P(TB(1)). By the similar computation processing, internal pressure increase amount calculating unit 110 calculates each of P(TB(1)) to P(TB(m)), and calculates a sum of calculated P(TB(1)) to P(TB(m)) as internal pressure increase amount P. As described above, internal pressure increase amount calculating unit 110 calculates the history (temporal change) of internal pressure increase amount P shown in FIG. 5.

Figure 5:
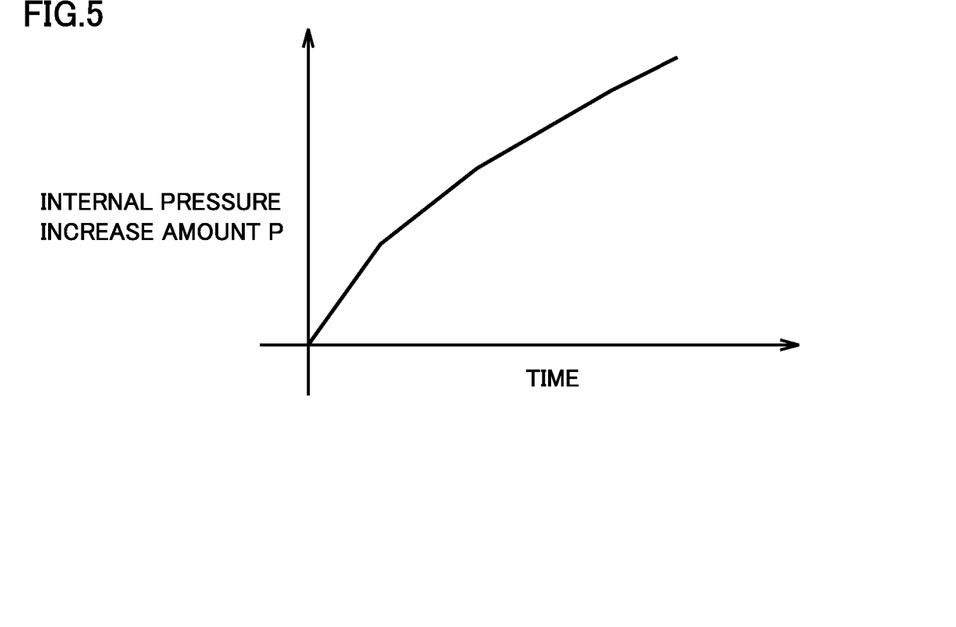
FIG. 5 shows a temporal change in internal pressure increase amount.

The vertical axis in FIG. 5 indicates internal pressure increase amount P, and the horizontal axis in FIG. 5 indicates the time. As shown in FIG. 5, internal pressure increase amount P changes to increase as the elapsed time becomes longer. The temporal change in internal pressure increase amount P shown in FIG. 5 is one example and the change is not limited to the change shown in FIG. 5.

Internal pressure fluctuation amount calculating unit 120 calculates a history (temporal change) of pressure (external pressure) Pout outside battery cell 22, based on the altitude information received from ECU 40. Internal pressure fluctuation amount calculating unit 120 estimates an outside pressure (atmospheric pressure) from the altitude of vehicle 10, and calculates the estimated outside pressure as external pressure Pout.

Internal pressure fluctuation amount calculating unit 120 calculates a history (temporal change) of pressure Pin inside battery cell 22. Specifically, from the history of internal pressure increase amount P calculated by internal pressure increase amount calculating unit 110 and the history of battery temperature TB, internal pressure fluctuation amount calculating unit 120 calculates the history of pressure Pin inside battery cell 22 by using the Boyle-Charle's law (pv=nRT).

Figure 6:
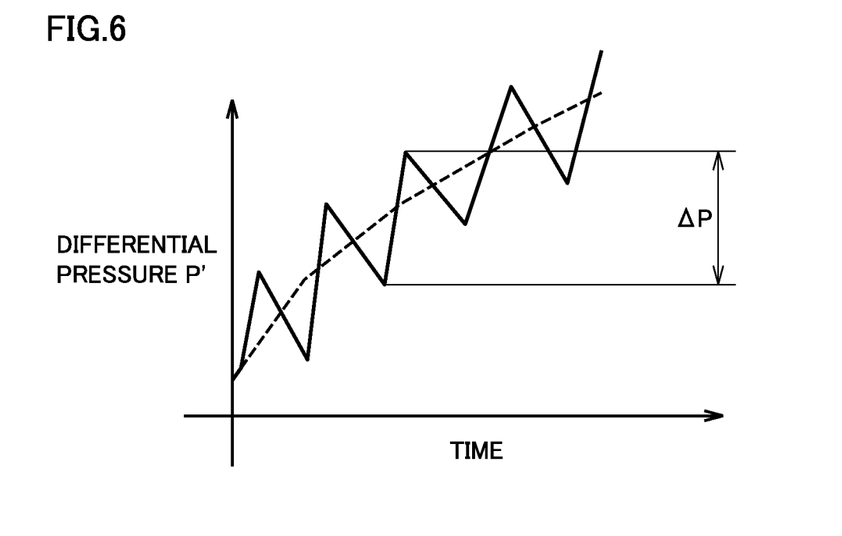
FIG. 6 shows a temporal change in differential pressure.

Internal pressure fluctuation amount calculating unit 120 calculates a differential pressure P' (=Pin−Pout) between calculated Pin and Pout. FIG. 6 shows a history (temporal change) of calculated differential pressure P'. The vertical axis in FIG. 6 indicates differential pressure P', and the horizontal axis in FIG. 6 indicates the time. As shown by a broken line in FIG. 6, a fluctuation center of differential pressure P' changes to increase as the elapsed time becomes longer, based on a change in internal pressure increase amount P. Differential pressure P' changes to fluctuate upwardly and downwardly with respect to the broken line in FIG. 6, in accordance with a change in altitude of vehicle 10 (external pressure Pout), a change in battery temperature TB, or the like.

Internal pressure fluctuation amount calculating unit 120 calculates an internal pressure fluctuation amount ΔP from the history of differential pressure P'. For example, when differential pressure P' changes as shown in FIG. 6, internal pressure fluctuation amount calculating unit 120 calculates internal pressure fluctuation amount ΔP of differential pressure P' from a difference between adjacent extreme values. For example, internal pressure fluctuation amount calculating unit 120 may calculate internal pressure fluctuation amount ΔP from a difference between a maximum value and a minimum value of differential pressure P' for a prescribed time period, or may calculate internal pressure fluctuation amount ΔP from a difference between a maximum value from when differential pressure P' exceeds the fluctuation center shown by the broken line in FIG. 6 to when differential pressure P' falls below the fluctuation center and a minimum value from when differential pressure P' falls below the fluctuation center shown by the broken line in FIG. 6 to when differential pressure P' exceeds the fluctuation center.

Figure 7:
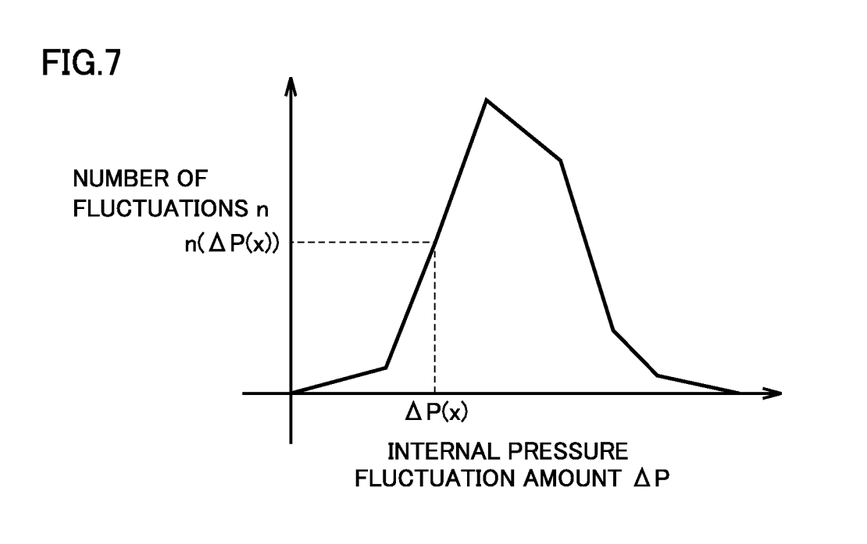
FIG. 7 shows a relation between an internal pressure fluctuation amount and the number of fluctuations.

FIG. 7 shows a relation between internal pressure fluctuation amount ΔP and the number of fluctuations. The vertical axis in FIG. 7 indicates the number of fluctuations, and the horizontal axis in FIG. 7 indicates internal pressure fluctuation amount ΔP. Internal pressure fluctuation amount calculating unit 120 calculates the relation between internal pressure fluctuation amount ΔP and the number of fluctuations shown in FIG. 7, based on calculated internal pressure fluctuation amount ΔP.

As described below, for example, internal pressure fluctuation amount calculating unit 120 calculates the relation between internal pressure fluctuation amount ΔP and the number of fluctuations n shown in FIG. 7.

For example, every time internal pressure fluctuation amount ΔP is calculated from the history of differential pressure P' shown in FIG. 6, it is specified which of a plurality of internal pressure fluctuation amounts ΔP(1) to ΔP(M) internal pressure fluctuation amount ΔP thus calculated is associated with. The number of fluctuations associated with the specified internal pressure fluctuation amount is increased by 1. The plurality of internal pressure fluctuation amounts ΔP(1) to ΔP(M) are associated with ranges of the plurality of internal pressure fluctuation amounts each having a prescribed interval, respectively. Such a process is executed on all internal pressure fluctuation amounts ΔP, thereby creating data indicating the relation between internal pressure fluctuation amount ΔP and the number of fluctuations n shown in FIG. 7.

The data indicating the relation between internal pressure fluctuation amount ΔP and the number of fluctuations n shown in FIG. 7 is created, and thereby, the number of fluctuations n(ΔP(x)) when differential pressure P' fluctuates at internal pressure fluctuation amount ΔP(x) can, for example, be calculated.

D1 calculating unit 130 calculates first deterioration evaluation value D1 based on the calculated relation between internal pressure fluctuation amount ΔP and the number of fluctuations n shown in FIG. 7. D1 calculating unit 130 calculates first deterioration evaluation value D1 based on first ratio n(ΔP(x))/N(ΔP(x)) between the number of fluctuations n(ΔP(x)) when differential pressure P' fluctuates at internal pressure fluctuation amount ΔP(x) and the upper limit number of fluctuations N(ΔP(x)) corresponding to internal pressure fluctuation amount ΔP(x).

A method for calculating the upper limit number of fluctuations N and first deterioration evaluation value D1 will be described below. The upper limit number of fluctuations N and first deterioration evaluation value D1 are calculated for each of the plurality of components of battery cell 22. The method for calculating the upper limit number of fluctuations N and first deterioration evaluation value D1 for any one of the plurality of components of battery cell 22 will be described below. However, the same is applied as well to the other components, and thus, detailed description thereof will not be repeated.

Figure 8:
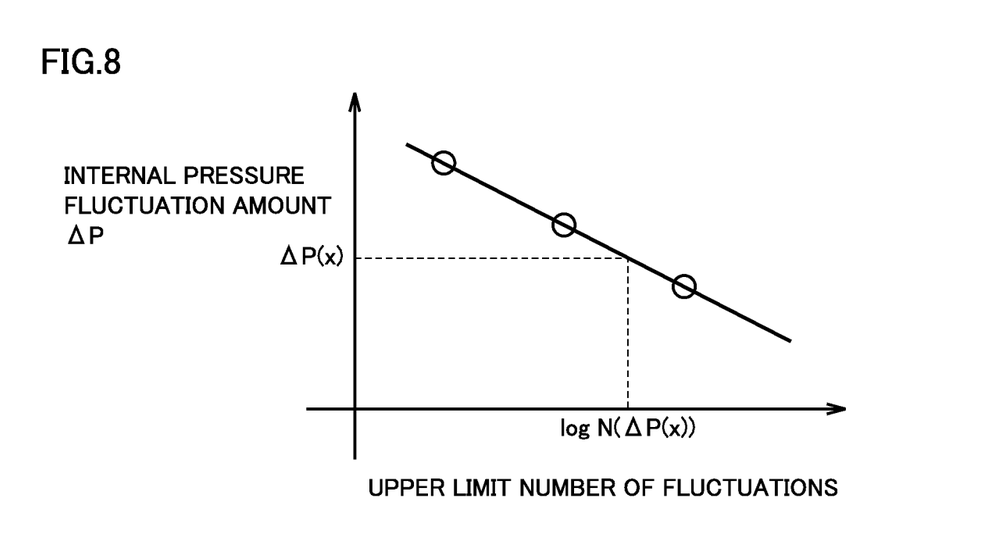
FIG. 8 shows a relation between the upper limit number of fluctuations and an internal pressure fluctuation amount.

An S-N diagram corresponding to the component of battery cell 22 as shown in FIG. 8 is prestored in storage medium 102 of PC 100. FIG. 8 shows a relation between internal pressure fluctuation amount ΔP of battery cell 22 and the upper limit number of fluctuations N until the component reaches a failed state. The vertical axis in FIG. 8 indicates internal pressure fluctuation amount ΔP, and the horizontal axis in FIG. 8 indicates a logarithmic value of the upper limit number of fluctuations N. The S-N diagram can be known from, for example, design data, experimental data and the like of the component of battery cell 22.

The relation between internal pressure fluctuation amount ΔP and the upper limit number of fluctuations N is preliminarily calculated by the bench test and the like. For example, the relation between internal pressure fluctuation amount ΔP and the logarithmic value (logarithmic value such as a common logarithm or a natural logarithm) of the upper limit number of fluctuations N can be expressed by a linear function equation. Therefore, by obtaining a combination of internal pressure fluctuation amount ΔP and the upper limit number of fluctuations N at two or more points by the bench test and the like, an inclination and an intercept of the linear function equation are calculated. Based on the linear function equation obtained from the calculated inclination and intercept, a logarithmic value of the upper limit number of fluctuations N(ΔP(x)) corresponding to internal pressure fluctuation amount ΔP(x) can be calculated as shown in FIG. 8. As shown in FIG. 8, as internal pressure fluctuation amount ΔP becomes larger, the upper limit number of fluctuations N (logarithmic value of the upper limit number of fluctuations N) becomes smaller. The relation between internal pressure fluctuation amount ΔP and the upper limit number of fluctuations N shown in FIG. 8 is one example and the relation is not limited to the relation shown in FIG. 8.

D1 calculating unit 130 calculates first deterioration evaluation value D1 based on the number of fluctuations n and the upper limit number of fluctuations N. More specifically, D1 calculating unit 130 calculates first deterioration evaluation value D1 by using the following equation:

first deterioration evaluation value $D1 = \Sigma\{n(\Delta P((M)/N(\Delta P(M))\}$.

A method for calculating first deterioration evaluation value D1 will be described below. From the relation between internal pressure fluctuation amount ΔP and the number of fluctuations n shown in FIG. 7, D1 calculating unit 130 derives the number of fluctuations n(ΔP(1)) when internal pressure fluctuation amount ΔP is ΔP(1). From the linear function equation shown in FIG. 8, D1 calculating unit 130 calculates the upper limit number of fluctuations N(ΔP(1)) when internal pressure fluctuation amount ΔP is ΔP(1). D1 calculating unit 130 divides the number of fluctuations n(ΔP(1)) by the upper limit number of fluctuations N(ΔP(1)) to calculate D1(ΔP(1)). By the similar computation processing, D1 calculating unit 130 calculates each of D1(ΔP(1)) to D1(ΔP(M)), and calculates a sum of calculated values D1(ΔP(1)) to D1(ΔP(M)) as first deterioration evaluation value D1. D1 calculating unit 130 may calculate first deterioration evaluation value D1 (a ratio between the number of fluctuations n and the upper limit number of fluctuations N) in units of percent.

D2 calculating unit 140 calculates stay time t'(P'(x), TB(x)) which is the time in which differential pressure P' becomes differential pressure P'(x) and battery temperature TB becomes temperature TB(x) in battery cell 22, and calculates second deterioration evaluation value D2 based on second ratio t'(P'(x), TB(x))/T'(P'(x), TB(x)) between calculated stay time t'(P'(x), TB(x)) and upper limit stay time (creep fracture time) T'(P'(x), TB(x)) corresponding to this state.

A method for calculating stay time t', upper limit stay time T' and second deterioration evaluation value D2 will be described below. Upper limit stay time T' and second deterioration evaluation value D2 are calculated for each of the plurality of components of battery cell 22. The method for calculating upper limit stay time T' and second deterioration evaluation value D2 for any one (the same component as the aforementioned component for which the first deterioration evaluation value is calculated) of the plurality of components will be described below. However, the same is applied as well to the other components, and thus, detailed description thereof will not be repeated.

Figure 9:
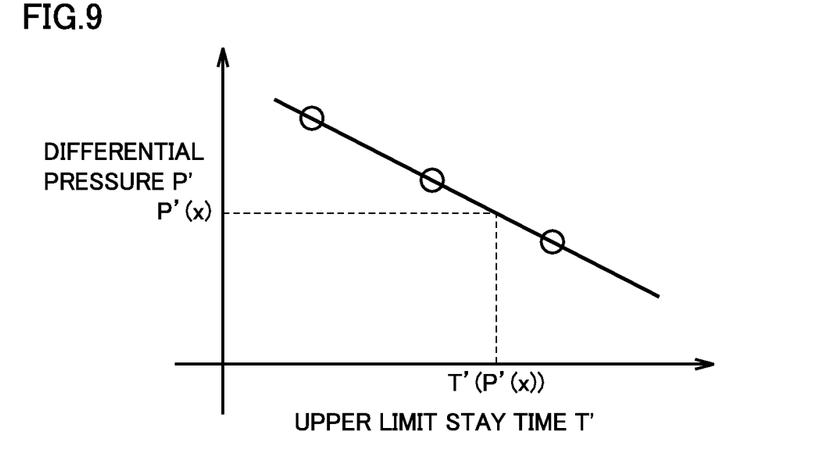
FIG. 9 shows a relation between an upper limit stay time and a differential pressure.

A relation between differential pressure P' and upper limit stay time T' shown in FIG. 9 when battery temperature TB is temperature TB(x) is prestored in storage medium 102 of PC 100. Furthermore, a plurality of relations between differential pressure P' and upper limit stay time T' shown in FIG. 9 corresponding to the plurality of battery temperatures TB(1) to TB(m), respectively, are stored in storage medium 102 of PC 100.

For example, the relation between differential pressure P' and upper limit stay time T' when battery temperature TB is temperature TB(x) can be expressed by the following linear function equation by using the Larson-Miller parameter:

differential pressure $P'=A$ (inclination)×temperature TB(x)×Log (upper limit stay time $T'$)+$B$ (intercept).

Therefore, by obtaining, by the bench test and the like, a combination of differential pressure P' and upper limit stay time T' at two or more points when battery temperature TB is temperature TB(x), an inclination and an intercept of the aforementioned linear function equation are calculated. Based on the linear function equation obtained from the calculated inclination and intercept, a logarithmic value of upper limit stay time T'(TB(x), P'(x)) corresponding to differential pressure P'(x) when battery temperature TB is temperature TB(x) can be calculated as shown in FIG. 9. As shown in FIG. 9, as differential pressure P' becomes higher, upper limit stay time T' becomes shorter. By calculating the relation between differential pressure P' and upper limit stay time T' shown in FIG. 9 under the environment of each of the plurality of battery temperatures TB(1) to TB(m), a relation among battery temperature TB, differential pressure P' and upper limit stay time T' is derived.

Figure 10:
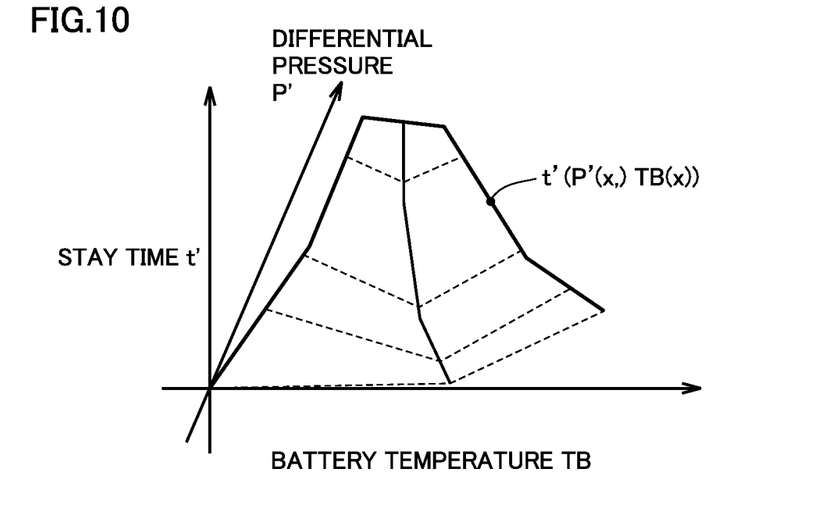
FIG. 10 shows a relation among a battery temperature, a stay time and a differential pressure.

In addition, when the history of differential pressure P' is calculated by internal pressure fluctuation amount calculating unit 120, D2 calculating unit 140 creates three-dimensional data indicating a relation among differential pressure P', battery temperature TB and stay time t' shown in FIG. 10, based on battery temperature TB for differential pressure P' at each time point as well as the relation between battery temperature TB and stay time t shown in FIG. 4.

The horizontal axis in FIG. 10 indicates battery temperature TB, and the vertical axis in FIG. 10 indicates stay time t', and the axis toward the backward direction in FIG. 10 indicates differential pressure P'. The relation between battery temperature TB and stay time t' shown in FIG. 10 is similar to the relation between battery temperature TB and stay time t shown in FIG. 4, and thus, detailed description thereof will not be repeated. Similarly to the relation between battery temperature TB and stay time t shown in FIG. 4, the relation between differential pressure P' and stay time t' shown in FIG. 10 is also such that the stay time is the longest near the center between a maximum value and a minimum value of differential pressure P', and as differential pressure P' comes closer to the minimum value (differential pressure P' becomes lower) or as differential pressure P' comes closer to the maximum value (differential pressure P' becomes higher), stay time t' becomes shorter. In FIG. 10, the relation among differential pressure P', battery temperature TB and stay time t' has a three-dimensional chevron shape in which a plane including the axis of differential pressure P' and the axis of battery temperature TB is a bottom surface. The relation among differential pressure P', battery temperature TB and stay time t' shown in FIG. 10 is one example and the relation is not limited to the relation shown in FIG. 10.

Data indicating the relation among differential pressure P', battery temperature TB and stay time t' shown in FIG. 10 is created, and thereby, stay time t'(P'(x), TB(x)) when battery temperature TB is temperature TB(x) and differential pressure P' is P'(x) can, for example, be calculated.

D2 calculating unit 140 calculates second deterioration evaluation value D2 based on a ratio between stay time t' calculated using FIG. 10 and upper limit stay time T' calculated using FIG. 9. D2 calculating unit 140 calculates second deterioration evaluation value D2 by using the following equation:

second deterioration evaluation value $D2=\Sigma\{t'(P'(M), TB(m))/T'(P'(M), TB(m))\}$.

An integer M and an integer m may be the same value, or may be different values.

A method for calculating second deterioration evaluation value D2 will be described below. From the relation among differential pressure P', battery temperature TB and stay time t' shown in FIG. 10, D2 calculating unit 140 derives a stay time t'(P'(1), TB(1)) when battery temperature TB is TB(1) and differential pressure P' is P'(1). From the relation between differential pressure P'(1) and upper limit stay time T' shown in FIG. 9 when battery temperature TB is TB(1), D2 calculating unit 140 calculates an upper limit stay time T'(P'(1), TB(1)) when battery temperature TB is TB(1) and differential pressure P' is P'(1). D2 calculating unit 140 divides stay time t'(P'(1), TB(1)) by upper limit stay time T'(P'(1), TB(1)) to calculate D2(P'(1), TB(1)). By the similar computation processing, D2 calculating unit 140 calculates each of D2(P'(1), TB(1)) to D2(P'(M), TB(m)), and calculates a sum of calculated values D2(P'(1), TB(1)) to D2(P'(M), TB(m)) as second deterioration evaluation value D2. D2 calculating unit 140 may calculate second deterioration evaluation value D2 (a ratio between stay time t' and upper limit stay time T') in units of percent.

Deterioration determining unit 150 determines whether a sum of first deterioration evaluation value D1 and second deterioration evaluation value D2 is larger than a threshold value A or not. Threshold value A is a threshold value for determining that battery cell 22 is in a deteriorated state, and is adapted by the bench test and the like. When the sum of first deterioration evaluation value D1 and second deterioration evaluation value D2 is larger than threshold value A, deterioration determining unit 150 determines that battery cell 22 (battery 20) is in the deteriorated state, and turns on a deterioration determination flag. When the sum of first deterioration evaluation value D1 and second deterioration evaluation value D2 is equal to or smaller than threshold value A, deterioration determining unit 150 determines that battery cell 22 is not in the deteriorated state.

Deterioration determining unit 150 may set threshold value A for each component of battery cell 22, and for each component, deterioration determining unit 150 may determine whether the sum of first deterioration evaluation value D1 and second deterioration evaluation value D2 is larger than threshold value A or not, and when it is determined in any one of the plurality of components that the sum of first deterioration evaluation value D1 and second deterioration evaluation value D2 is larger than threshold value A, deterioration determining unit 150 may determine that battery cell 22 is in the deteriorated state. Threshold value A may be common to the plurality of components of battery cell 22.

Notifying unit 160 notifies whether battery 20 can be reused or not, based on the result of deterioration determination by deterioration determining unit 150. For example, when deterioration determining unit 150 determines that the sum of first deterioration evaluation value D1 and second deterioration evaluation value D2 is larger than the threshold value, notifying unit 160 notifies that battery 20 cannot be reused because battery cell 22 is in the deteriorated state. For example, when deterioration determining unit 150 determines that the sum of first deterioration evaluation value D1 and second deterioration evaluation value D2 is equal to or smaller than the threshold value, notifying unit 160 notifies that battery 20 can be reused because battery cell 22 is not in the deteriorated state. Notifying unit 160 may, for example, cause a display device such as a display connected to PC 100 to display whether battery 20 can be reused or not by using texts, images and the like, or may make a notification by sound by using a speaker and the like.

A control process executed by PC 100 which is the deterioration determining device according to the present embodiment will be described with reference to FIG. 11.

In S100, PC 100 calculates internal pressure increase amount P in battery cell 22. In S102, PC 100 calculates internal pressure fluctuation amount ΔP based on calculated internal pressure increase amount P. In S104, PC 100 calculates first deterioration evaluation value D1. In S106, PC 100 calculates second deterioration evaluation value D2. The methods for calculating internal pressure increase amount P, internal pressure fluctuation amount ΔP, first deterioration evaluation value D1, and second deterioration evaluation value D2 are as described above, and thus, detailed description thereof will not be repeated.

In S108, PC 100 determines whether or not first deterioration evaluation value D1+second deterioration evaluation value D2 is equal to or smaller than threshold value A. If it is determined that first deterioration evaluation value D1+second deterioration evaluation value D2 is equal to or smaller than threshold value A (YES in S108), the process proceeds to S110. If not (NO in S108), the process proceeds to S112.

In S110, PC 100 determines and notifies that battery 20 can be shipped (reused) as a secondhand battery. In S112, PC 100 determines and notifies that battery 20 cannot be shipped (reused) as a secondhand battery.

The operation of PC 100 which is the deterioration determining device according to the present embodiment based on the aforementioned structure and flowchart will be described.

For example, a case is assumed in which battery 20 mounted on vehicle 10 is removed and replaced with a replacement battery in a shop where PC 100 which is the deterioration determining device according to the present embodiment is placed.

When an operator connects PC 100 to ECU 40 of vehicle 10 by the communication cable to allow communication between PC 100 and ECU 40, the history of battery temperature TB and the altitude information stored in memory 42 of ECU 40 are transmitted to PC 100 in response to the prescribed operation of PC 100 by the operator.

Based on the received history of battery temperature TB and the received altitude information, PC 100 calculates internal pressure increase amount P of battery cell 22 included in battery 20 removed from vehicle 10 as described with reference to FIGS. 3 to 5 (S100), calculates internal pressure fluctuation amount ΔP as described with reference to FIG. 6 (S102), and calculates first deterioration evaluation value D1 as described with reference to FIGS. 7 and 8 (S104).

Furthermore, PC 100 calculates second deterioration evaluation value D2 as described with reference to FIGS. 9 and 10 (S106), and determines whether or not first deterioration evaluation value D1+second deterioration evaluation value D2 is equal to or smaller than threshold value A (S108).

If it is determined that first deterioration evaluation value D1+second deterioration evaluation value D2 is equal to or smaller than threshold value A (YES in S108), it is notified that battery 20 can be shipped as a secondhand battery (S110).

On the other hand, if it is determined that first deterioration evaluation value D1+second deterioration evaluation value D2 is larger than threshold value A (NO in S108), it is notified that battery 20 cannot be shipped as a secondhand battery (S112).

As described above, in the deterioration determining device for the battery according to the present embodiment, both first deterioration evaluation value D1 and second deterioration evaluation value D2 are calculated in consideration of differential pressure P' between the internal pressure and the external pressure of battery cell 22. Therefore, the deterioration state of battery cell 22 is determined based on first deterioration evaluation value D1 and second deterioration evaluation value D2, and thereby, the deterioration state of battery 20 can be determined with a high degree of accuracy, in consideration of fluctuations in internal pressure of battery cell 22. Thus, it is possible to provide the deterioration determining device that determines the deterioration state with a high degree of accuracy, in consideration of fluctuations in internal pressure of the battery.

Modification of the Present Embodiment

PC 100 which is the deterioration determining device according to the present embodiment has been described as notifying that the battery cannot be shipped as a secondhand battery when the sum of first deterioration evaluation value D1 and second deterioration evaluation value D2 is larger than threshold value A, and determining and notifying that the battery can be shipped as a secondhand battery when the sum of first deterioration evaluation value D1 and second deterioration evaluation value D2 is equal to or smaller than threshold value A. However, PC 100 is not particularly limited thereto.

For example, PC 100 may notify that the battery cannot be shipped as a secondhand battery when the sum of first deterioration evaluation value D1 and second deterioration evaluation value D2 is larger than a threshold value B (>threshold value A), notify that the battery can be shipped (reused) as a secondhand battery to a prescribed region (e.g., all regions) when the sum of first deterioration evaluation value D1 and second deterioration evaluation value D2 is equal to or smaller than threshold value A, and notify that the battery can be shipped (reused in a limited way) as a secondhand battery to a region narrower than the prescribed region when the sum of first deterioration evaluation value D1 and second deterioration evaluation value D2 is larger than threshold value A and equal to or smaller than threshold value B.

A control process executed by PC 100 which is the deterioration determining device for the battery according to the present modification will be described with reference to FIG. 12, for example.

Figure 11:
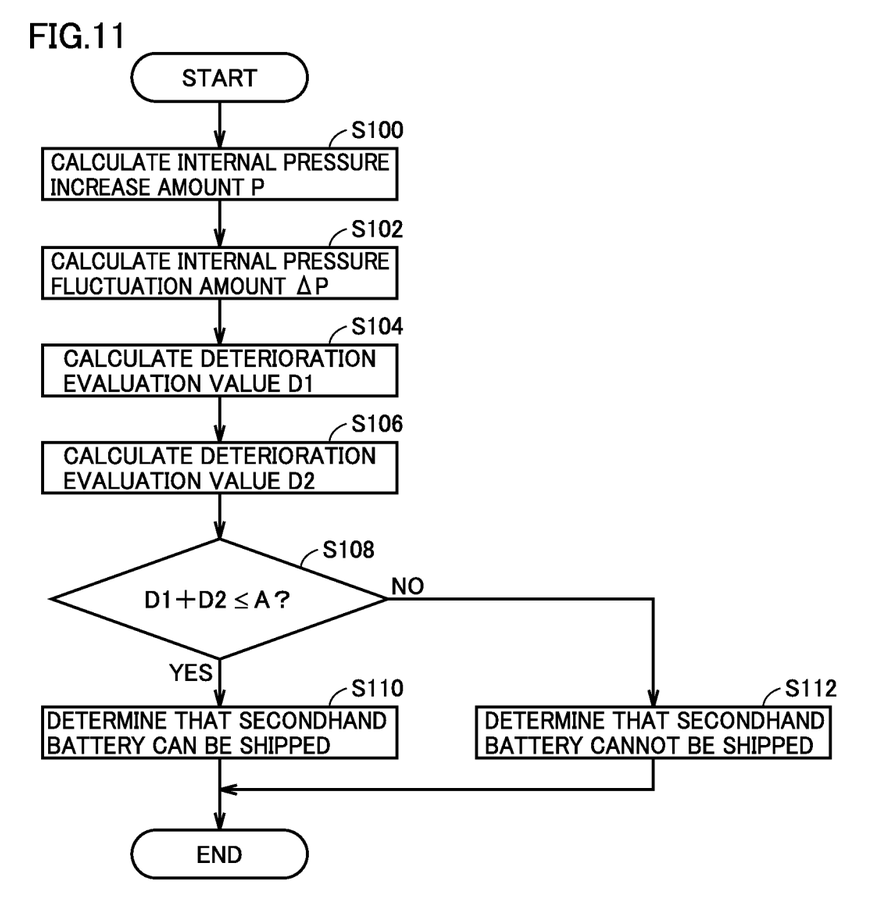
FIG. 11 is a flowchart showing a deterioration determination process executed by the PC which is the deterioration determining device for a battery according to the present embodiment.
Figure 12:
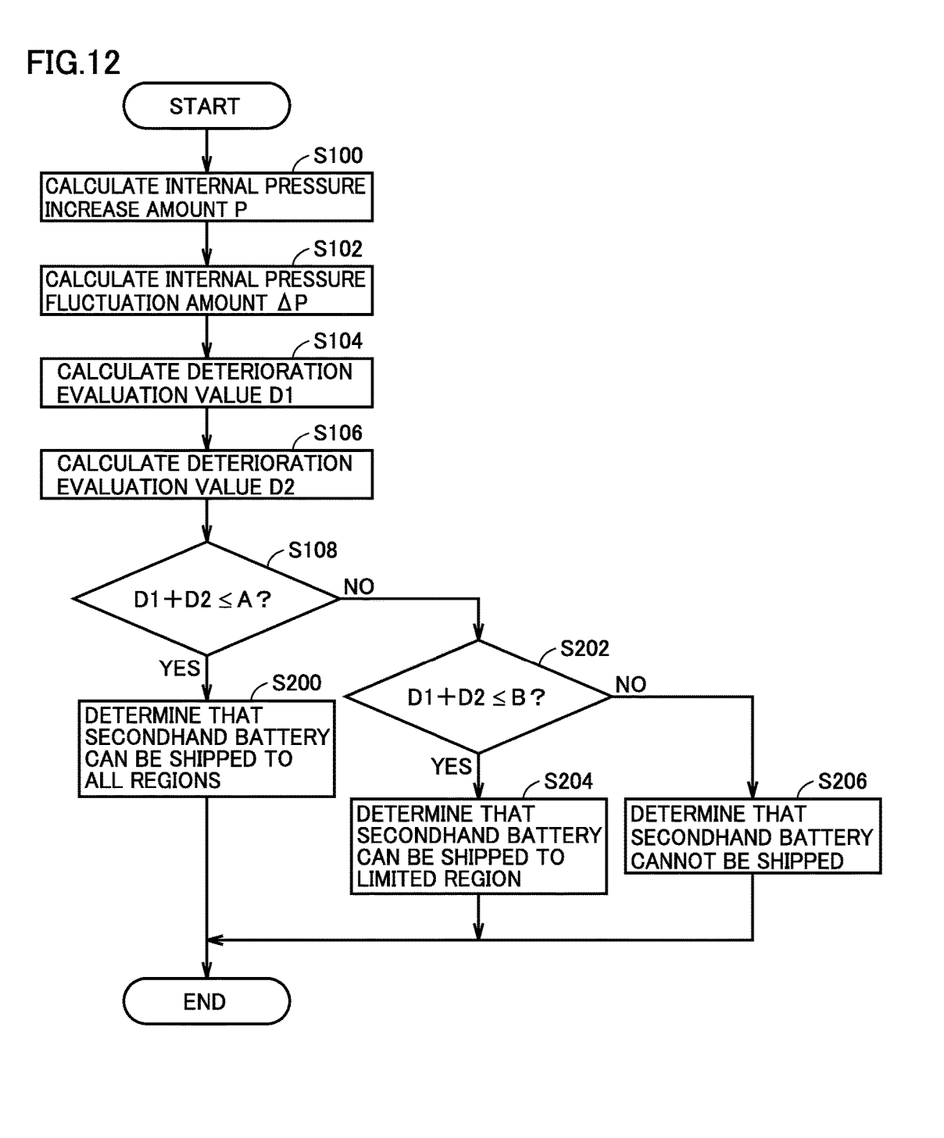
FIG. 12 is a flowchart showing a deterioration determination process executed by a PC which is a deterioration determining device according to a modification of the present embodiment.

The processing in S100 to S108 of the flowchart in FIG. 12 is the same as the processing in S100 to S108 of the flowchart in FIG. 11, and thus, detailed description thereof will not be repeated.

If it is determined that first deterioration evaluation value D1+second deterioration evaluation value D2 is equal to or smaller than threshold value A (YES in S108), PC 100 notifies the operator in S200 that battery 20 can be shipped as a secondhand battery to all regions.

If it is determined that first deterioration evaluation value D1+second deterioration evaluation value D2 is larger than threshold value A (NO in S108), PC 100 determines in S202 whether or not first deterioration evaluation value D1+second deterioration evaluation value D2 is equal to or smaller than threshold value B. Threshold value B is larger than threshold value A and is a threshold value for determining whether battery 20 can be shipped or not as a secondhand battery to a limited region (region narrower than all regions and under the environment in which deterioration of battery cell 22 progresses more slowly than in the other regions of all regions). The limited region may be, for example, a region where the outside pressure is equal to or higher than a prescribed outside pressure, or may be a region where the temperature is equal to or lower than a prescribed temperature. The limited region is not particularly limited, while the limited region is a region specified based on at least the outside pressure or the temperature.

If it is determined that first deterioration evaluation value D1+second deterioration evaluation value D2 is equal to or smaller than threshold value B (YES in S202), the process proceeds to S204. If not (NO in S202), the process proceeds to S206.

In S204, PC 100 determines and notifies that battery 20 can be shipped as a secondhand battery to the limited region. In S206, PC 100 determines and notifies that battery 20 cannot be shipped (reused) as a secondhand battery.

With this, the region to which battery 20 can be shipped can be specified by using threshold values A and B, and thus, battery 20 can be reused effectively.

Furthermore, the deterioration determining device according to the aforementioned first embodiment has been described as being implemented by PC 100 placed in facilities such as a shop. However, the deterioration determining device according to the aforementioned first embodiment may be implemented by, for example, ECU 40 mounted on vehicle 10.

Figure 13:
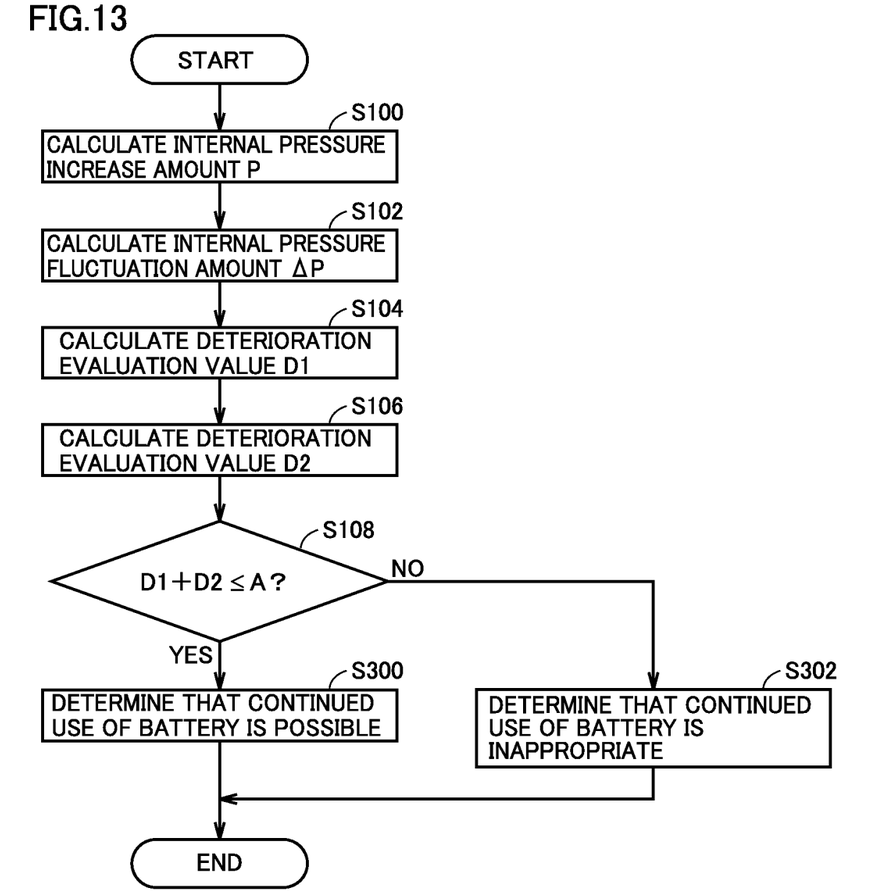
FIG. 13 is a flowchart showing one example of the deterioration determination process when the deterioration determining device is implemented by an ECU mounted on a vehicle in the modification of the present embodiment.

FIG. 13 shows a flowchart showing one example of a deterioration determination process when the deterioration determining device is implemented by, for example, ECU 40 mounted on vehicle 10.

The processing in S100 to S108 of the flowchart in FIG. 13 is the same as the processing in S100 to S108 of the flowchart in FIG. 11 except that the processing is executed by ECU 40 instead of PC 100, and thus, detailed description thereof will not be repeated.

If it is determined that first deterioration evaluation value D1+second deterioration evaluation value D2 is equal to or smaller than threshold value A (YES in S108), ECU 40 determines and notifies in S300 that continued use of battery 20 mounted on vehicle 10 is possible.

If it is determined that first deterioration evaluation value D1+second deterioration evaluation value D2 is larger than threshold value A (NO in S108), ECU 40 determines in S302 that continued use of battery 20 mounted on vehicle 10 is inappropriate and notifies that replacement of battery 20 is encouraged.

With this, even during driving of vehicle 10, the deterioration state of the components of battery cell 22 can be determined with a high degree of accuracy and the user can be encouraged to replace battery 20 at appropriate timing.

In the present embodiment, the case of providing one battery temperature sensor 44 in battery 20 has been described. However, a plurality of battery temperature sensors 44 may be provided at a plurality of locations or at a specific location. Battery temperature sensor 44 may, for example, be provided for each battery cell, for each battery module obtained by combining the prescribed number of battery cells, or for each battery pack obtained by combining the prescribed number of battery modules.

When the plurality of battery temperature sensors 44 are provided at the plurality of locations, ECU 40 may calculate an average value of a plurality of detection values obtained from the plurality of battery temperature sensors 44, to obtain the history of battery temperature TB. Alternatively, ECU 40 may obtain the history of battery temperature TB for each unit of provision of battery temperature sensors 44 (for each battery cell, for each battery module or for each battery pack), and use the history of battery temperature TB to calculate first deterioration evaluation value D1 and second deterioration evaluation value D2.

In the present embodiment, the case of calculating external pressure Pout of battery cell 22 based on the altitude information has been described. However, when vehicle 10 is provided with an outside pressure sensor, a history (temporal change) of the outside pressure obtained by using the outside pressure sensor and the like may be obtained and stored in memory 42 instead of the altitude information, and external pressure Pout of battery cell 22 may be calculated based on the history of the outside pressure.

In the present embodiment, the history of battery temperature TB and the altitude information have been described as being stored in ECU 40 of vehicle 10 having battery 20 mounted thereon. However, the history of battery temperature TB and the altitude information may be stored in, for example, a storage medium such as a memory mounted separately on battery 20. In this case, PC 100 may read the history of battery temperature TB and the altitude information from the memory mounted on battery 20, when PC 100 is connected to battery 20 to allow communication therebetween.

In the present embodiment, threshold value A has been described as the threshold value for determining whether battery cell 22 is in the deteriorated state or not. However, threshold value A may, for example, be a threshold value for determining whether or not battery cell 22 is in the deteriorated state to such an extent that a prescribed performance can be ensured during a warranty period of the secondhand battery.

In the present embodiment, both stay time t' and upper limit stay time T' have been described as being calculated based on the history of differential pressure P' and the history of battery temperature TB. However, both stay time t' and upper limit stay time T' may be calculated based on the history of differential pressure P'.

In the present embodiment, description has been given to the case of comparing the sum of first deterioration evaluation value D1 based on the number of fluctuations at internal pressure fluctuation amount ΔP and second deterioration evaluation value D2 based on the stay time with threshold value A, and determining whether battery 20 is in the deteriorated state or not and whether battery 20 can be reused or not as a secondhand battery. However, the present invention is not particularly limited thereto. PC 100 may, for example, compare, with the threshold value, a sum of values obtained by multiplying each of first deterioration evaluation value D1 and second deterioration evaluation value D2 by a prescribed weight coefficient or correction coefficient, and determine whether battery 20 is in the deteriorated state or not and whether battery 20 can be reused or not as a secondhand battery. Alternatively, PC 100 may compare, with the threshold value, a sum (D1+D2+D3) of first deterioration evaluation value D1, second deterioration evaluation value D2, and a third deterioration evaluation value D3 based on vibrations (acceleration) applied to battery 20, for example, and determine whether battery 20 is in the deteriorated state or not and whether battery 20 can be reused or not as a secondhand battery. Alternatively, PC 100 may correct each of first deterioration evaluation value D1 and second deterioration evaluation value D2 depending on a type of a used material of the components and the usage conditions of the battery (usage conditions related to the increase in internal pressure, such as the frequency of charging and discharging), compare the sum of corrected first deterioration evaluation value D1 and second deterioration evaluation value D2 with the threshold value, and determine whether battery 20 is in the deteriorated state or not and whether battery 20 can be reused or not as a secondhand battery.

Furthermore, in the present embodiment, PC 100 has been described as calculating each of first deterioration evaluation value D1 and second deterioration evaluation value D2, and determining the deterioration state of the components of battery cell 22 based on calculated first deterioration evaluation value D1 and second deterioration evaluation value D2. However, the present invention is not particularly limited to such a determination method.

For example, PC 100 may calculate at least either one of first deterioration evaluation value D1 and second deterioration evaluation value D2, and determine the deterioration state of the components of battery cell 22 based on at least either one of calculated first deterioration evaluation value D1 and second deterioration evaluation value D2.

More specifically, PC 100 may calculate first deterioration evaluation value D1, and determine that the components of battery cell 22 are in the deteriorated state when calculated first deterioration evaluation value D1 is larger than the threshold value. Alternatively, PC 100 may calculate second deterioration evaluation value D2, and determine that the components of battery cell 22 are in the deteriorated state when calculated second deterioration evaluation value D2 is larger than the threshold value.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A deterioration determining device for a battery, comprising:
    a calculating unit for calculating the number of fluctuations when a differential pressure between an internal pressure and an external pressure of a battery fluctuates at a predetermined amount of fluctuation, calculating a time in which said differential pressure becomes a predetermined differential pressure, and calculating at least either one of a first deterioration evaluation value and a second deterioration evaluation value, said first deterioration evaluation value being based on a first ratio between said calculated number of fluctuations and the predetermined upper limit number of fluctuations corresponding to said predetermined amount of fluctuation, and said second deterioration evaluation value being based on a second ratio between said calculated time and a predetermined upper limit time corresponding to said predetermined differential pressure; and
    a deterioration determining unit for determining a deterioration state of said battery based on at least either one of said first deterioration evaluation value and said second deterioration evaluation value calculated by said calculating unit.

2. The deterioration determining device for a battery according to claim 1, wherein
    said deterioration determining unit determines that said battery is in a deteriorated state, when a sum of said first deterioration evaluation value and said second deterioration evaluation value is larger than a threshold value.

3. The deterioration determining device for a battery according to claim 1, wherein
    said calculating unit calculates a plurality of said first ratios corresponding to a plurality of amounts of fluctuation, respectively, which include said predetermined amount of fluctuation, and calculates a sum of the plurality of said first ratios as said first deterioration evaluation value.

4. The deterioration determining device for a battery according to claim 1, wherein
    said calculating unit calculates a plurality of said second ratios corresponding to a plurality of differential pressures, respectively, which include said predetermined differential pressure, and calculates a sum of the plurality of said second ratios as said second deterioration evaluation value.

5. The deterioration determining device for a battery according to claim 1, further comprising
    a reuse determining unit for determining whether said battery can be reused or not, based on a result of comparison between a threshold value and a sum of said first deterioration evaluation value and said second deterioration evaluation value.

6. The deterioration determining device for a battery according to claim 1, further comprising
    a reuse determining unit for determining that said battery can be reused in a prescribed region when a sum of said first deterioration evaluation value and said second deterioration evaluation value is smaller than a first threshold value, determining that said battery cannot be reused when the sum of said first deterioration evaluation value and said second deterioration evaluation value is larger than a second threshold value, and determining that said battery can be reused in a region narrower than said prescribed region when the sum of said first deterioration evaluation value and said second deterioration evaluation value is between said first threshold value and said second threshold value, wherein
    said second threshold value is larger than said first threshold value.

7. The deterioration determining device for a battery according to claim 1, wherein
    said battery and said deterioration determining device are mounted on a vehicle, and
    during driving of said vehicle, said deterioration determining unit determines the deterioration state of said battery based on at least either one of said first deterioration evaluation value and said second deterioration evaluation value.

* * * * *